United States Patent
Kim

(10) Patent No.: US 12,512,351 B2
(45) Date of Patent: Dec. 30, 2025

(54) COVER FOR MODULE TRAY AND MODULE TRAY FOR SEMICONDUCTOR DEVICE INCLUDING THE SAME

(71) Applicant: SAMSUNG ELECTRONICS CO., LTD., Suwon-si (KR)

(72) Inventor: Taegeon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 99 days.

(21) Appl. No.: 18/367,655

(22) Filed: Sep. 13, 2023

(65) Prior Publication Data

US 2024/0128105 A1 Apr. 18, 2024

(30) Foreign Application Priority Data

Oct. 14, 2022 (KR) .................. 10-2022-0132030

(51) Int. Cl.
*H01L 21/673* (2006.01)
*B65D 43/02* (2006.01)
*B65D 51/24* (2006.01)

(52) U.S. Cl.
CPC ...... *H01L 21/6735* (2013.01); *B65D 43/0202* (2013.01); *B65D 51/245* (2013.01);
(Continued)

(58) Field of Classification Search
CPC ...... B65D 51/245; B65D 51/24; B65D 51/26; B65D 25/205; B65D 83/08; B65D 85/48; B65D 2203/02
(Continued)

(56) References Cited

U.S. PATENT DOCUMENTS 6,929,002 B1 * 8/2005 Adrian ............... F24H 1/06
  220/521
7,252,195 B2 * 8/2007 Mandle ............... A47L 13/51
  206/812
(Continued)

FOREIGN PATENT DOCUMENTS

KR 10-1995-0002056 Y1 3/1995
KR 10-2002-0097441 A 12/2002
(Continued)

*Primary Examiner* — Robert Poon
(74) *Attorney, Agent, or Firm* — Muir Patent Law, PLLC

(57) ABSTRACT

A cover for a module tray includes a cover structure to cover a case of a semiconductor device, and a card accommodation portion on an upper surface of the cover structure to accommodate a card. The card accommodation portion includes a first bracket having a first accommodation guide extending in the first horizontal direction, a second bracket spaced apart from the first bracket and having second and third accommodation guides, the second accommodation guide extending in the first horizontal direction to face the first accommodation guide, and the third accommodation guide extending in the second horizontal direction, and a third bracket spaced apart from the first and second brackets, and having fourth and fifth accommodation guides, the fourth accommodation guide extending in the first horizontal direction to face the first accommodation guide, and the fifth accommodation guide extending in the second horizontal direction to face the third accommodation guide.

18 Claims, 11 Drawing Sheets

(52) U.S. Cl.
CPC ...... *B65D 2203/02* (2013.01); *B65D 2203/10* (2013.01); *B65D 2543/00027* (2013.01); *B65D 2543/00194* (2013.01)

(58) Field of Classification Search
USPC .................................. 206/710, 711; 220/521
See application file for complete search history.

(56) References Cited

U.S. PATENT DOCUMENTS

| | | | |
|---|---|---|---|
| 8,937,483 B2 | 1/2015 | Jeong et al. | |
| 11,333,967 B2 | 5/2022 | Chiu et al. | |
| 11,427,385 B1* | 8/2022 | Cutter | B65D 77/26 |
| 2005/0269242 A1* | 12/2005 | Crisp | H01L 21/67333 |
| | | | 206/710 |
| 2006/0013647 A1* | 1/2006 | Farley | B65D 19/44 |
| | | | 403/329 |
| 2008/0264943 A1* | 10/2008 | Klure | B65D 43/0218 |
| | | | 220/212 |
| 2023/0348168 A1* | 11/2023 | Uchida | B65D 85/48 |

FOREIGN PATENT DOCUMENTS

| | | |
|---|---|---|
| KR | 10-0447637 B1 | 9/2004 |
| KR | 10-0596184 B1 | 7/2006 |
| KR | 10-0639557 B1 | 10/2006 |
| KR | 10-0944890 B1 | 3/2010 |

\* cited by examiner

COVER FOR MODULE TRAY AND MODULE TRAY FOR SEMICONDUCTOR DEVICE INCLUDING THE SAME

CROSS-REFERENCE TO RELATED APPLICATION

This application claims priority under 35 U.S.C. § 119 to Korean Patent Application No. 10-2022-0132030, filed on Oct. 14, 2022, in the Korean Intellectual Property Office (KIPO), the contents of which are herein incorporated by reference in their entirety.

BACKGROUND

1. Field

Example embodiments relate to a cover for a module tray and a module tray for a semiconductor device including the same. More particularly, example embodiments relate to a cover for a module tray configured to cover a case that accommodates a plurality of semiconductor substrates and a module tray for a semiconductor device including the same.

2. Description of the Related Art

A module tray may be used to store and operate a plurality of semiconductor substrates. A case of the module tray may have an upper side opening for accommodating the semiconductor substrates.

SUMMARY

According to example embodiments, a cover for a module tray includes a cover structure configured to cover a case that accommodates a semiconductor device, and a card accommodation portion provided on an upper surface of the cover structure, the card accommodation portion configured to accommodate a card to be inserted slidably in a first horizontal direction or in a second horizontal direction perpendicular to the first horizontal direction. The card accommodation portion includes a first bracket having a first accommodation guide that extends in the first horizontal direction, a second bracket arranged to be spaced apart from the first bracket, the second bracket having a second accommodation guide and a third accommodation guide, the second accommodation guide extending in the first horizontal direction to face the first accommodation guide, the third accommodation guide extending in the second horizontal direction, and a third bracket arranged to be spaced apart from the first and second brackets, the third bracket having a fourth accommodation guide and a fifth accommodation guide, the fourth accommodation guide extending in the first horizontal direction to face the first accommodation guide, the fourth accommodation guide defining a first accommodation space with the first and second accommodation guides, the fifth accommodation guide extending in the second horizontal direction to face the third accommodation guide, the fifth accommodation guide defining a second accommodation space with the third accommodation guide.

According to example embodiments, a cover for a module tray includes a cover structure configured to cover a case that accommodates a semiconductor device, a first bracket having a first accommodation guide that extends in a first horizontal direction from an upper surface of the cover structure, a second bracket arranged to be spaced apart from the first bracket, the second bracket having a second accommodation guide and a third accommodation guide, the second accommodation guide extending in the first horizontal direction, the third accommodation guide extending in a second horizontal direction perpendicular to the first horizontal direction, and a third bracket arranged to be spaced apart from the first and second brackets, the third bracket having a fourth accommodation guide and a fifth accommodation guide, the fourth accommodation guide extending in the first horizontal direction to define a first accommodation space with the first and second accommodation guides, the first accommodation space being configured to accommodate a lot card, the fifth accommodation guide extending in the second horizontal direction to define a second accommodation space with the first and third accommodation guides, the second accommodation space being configured to accommodate the lot card.

According to example embodiments, a module tray for a semiconductor device includes a case configured to accommodate the semiconductor device, the case having an upper side opening at an upper end thereof, a cover structure detachably mounted on the case, the cover structure being configured to cover the upper side opening, and a card accommodation portion provided on the cover structure, the card accommodation portion having a first accommodation portion and a second accommodation portion, the first accommodation portion accommodating a lot card in a first horizontal direction, the second accommodation portion accommodating the lot card in a second horizontal direction perpendicular to the first horizontal direction. The card accommodation portion includes a first bracket having a first accommodation guide that extends in the first horizontal direction, a second bracket arranged to be spaced apart from the first bracket, the second bracket having a second accommodation guide and a third accommodation guide, the second accommodation guide extending in the first horizontal direction to face the first accommodation guide, the third accommodation guide extending in the second horizontal direction, and a third bracket arranged to be spaced apart from the first and second brackets, the third bracket having a fourth accommodation guide and a fifth accommodation guide, the fourth accommodation guide extending in the first horizontal direction to face the first accommodation guide, the fourth accommodation guide defining a first accommodation space with the first and second accommodation guides, the fifth accommodation guide extending in the second horizontal direction to face the third accommodation guide, the fifth accommodation guide defining a second accommodation space with the third accommodation guide.

According to example embodiments, a cover for a module tray may include a cover structure configured to cover a case that accommodates a semiconductor device, and a card accommodation portion provided on an upper surface of the cover structure, the card accommodation portion configured to accommodate a card to be inserted slidably in a first horizontal direction or in a second horizontal direction perpendicular to the first horizontal direction. The card accommodation portion includes a first bracket having a first accommodation guide that extends in the first horizontal direction, a second bracket arranged to be spaced apart from the first bracket, the second bracket having a second accommodation guide and a third accommodation guide, the second accommodation guide extending in the first horizontal direction to face the first accommodation guide, the third accommodation guide extending in the second horizontal direction, and a third bracket arranged to be spaced apart from the first and second brackets, the third bracket having a fourth accommodation guide and a fifth accommodation guide, the fourth accommodation guide extending in the first horizontal direction to face the first accommodation guide, the fourth accommodation guide defining a first accommodation space with the first and second accommodation guides, the fifth accommodation guide extending in the second horizontal direction to face the third accommodation guide, the fifth accommodation guide defining a second accommodation space with the third accommodation guide.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be explained in detail with reference to the accompanying drawings.

Figure 1:
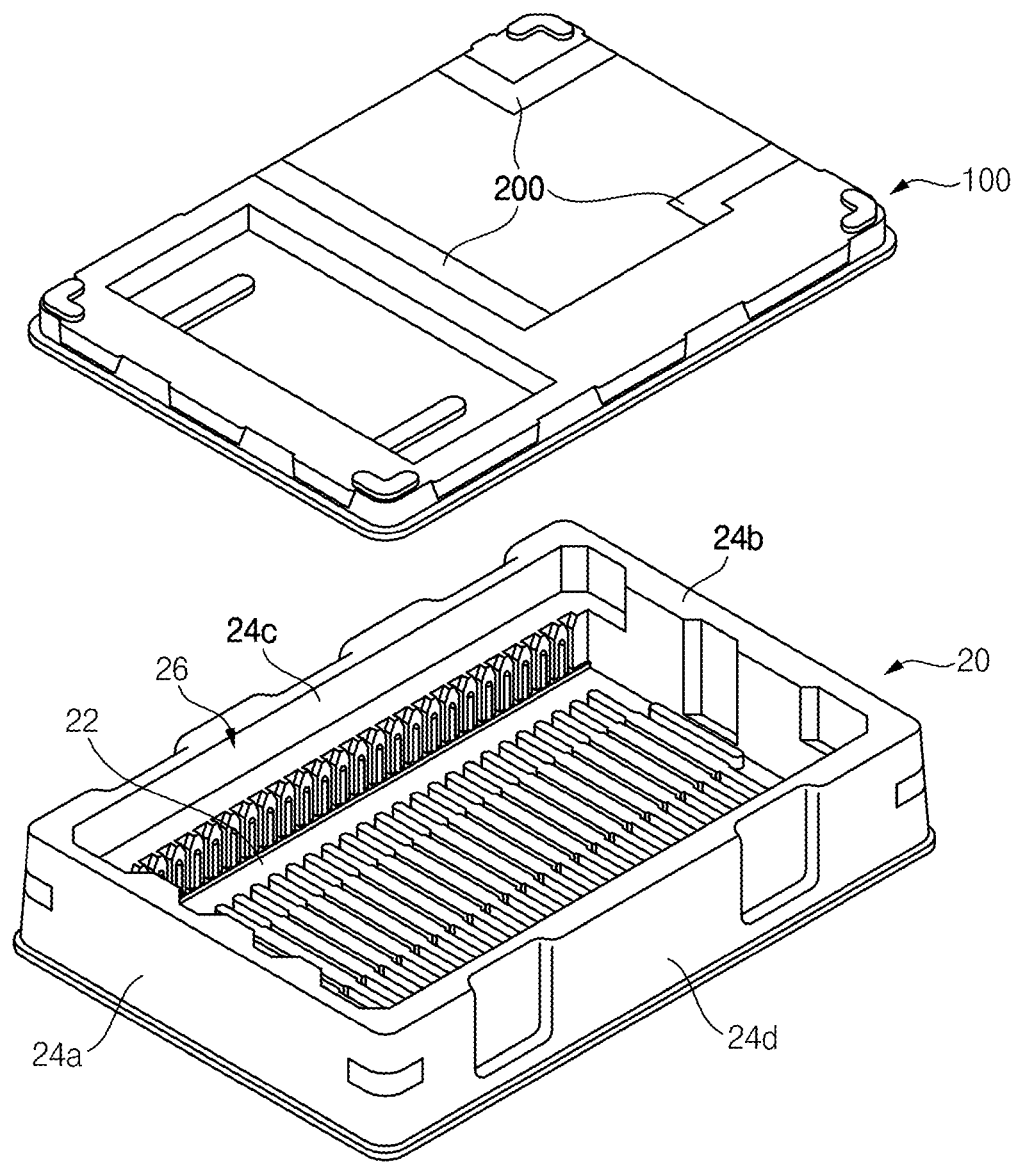
FIG. 1 is a perspective view illustrating a module tray for a semiconductor device in accordance with example embodiments.

FIG. 1 is a perspective view illustrating a module tray for a semiconductor device in accordance with example embodiments.

Referring to FIG. 1, a module tray 10 for a semiconductor device may include a case 20 that accommodates the semiconductor device, and a cover for the module tray that covers the case 20. The cover for the module tray may include a cover structure 100 that covers the case 20, and a card accommodation portion 200 that accommodates a card on the cover structure 100.

In example embodiments, the module tray 10 for the semiconductor device may be referred to a device that is capable of stably fixing, storing, and transporting the semiconductor device. The module tray 10 may protect the semiconductor device from external impact. The module tray 10 may provide a space that is capable of simultaneously receiving and transporting a plurality of the semiconductor devices.

The semiconductor device that is accommodated in the module tray 10 may include a semiconductor substrate. For example, the semiconductor substrate may include a printed circuit board (PCB) and/or a substrate on which a semiconductor package manufacturing process is performed. The PCB may include a multilayer circuit board that has vias and various circuits therein. For example, the semiconductor substrate may include a Dynamic Random Access Memory (DRAM). For example, the semiconductor substrate may include DDR3, DDR4, DDR5, LPDDR (Low Power Double Data Rate), and the like. The module tray 10 may serve as a carrier that loads a plurality of the semiconductor substrates therein in the semiconductor package manufacturing process.

The case 20 may include a box structure that has an opened upper surface and a rectangular parallelepiped shape. The case 20 may include a base plate 22 that defines an inner space, first and second sidewalls 24a and 24b facing each other, and third and fourth sidewalls 24c and 24d extending between the first and second sidewalls 24a and 24b. The case 20 may accommodate the semiconductor device into the inner space that is defined by the base plate 22 and the first to fourth sidewalls 24a, 24b, 24c, and 24d. The case 20 may accommodate or remove the semiconductor device through an upper surface opening 26.

Hereinafter, the cover structure 100 in FIG. 1 will be described in detail with reference to FIGS. 2-6.

Figure 2:
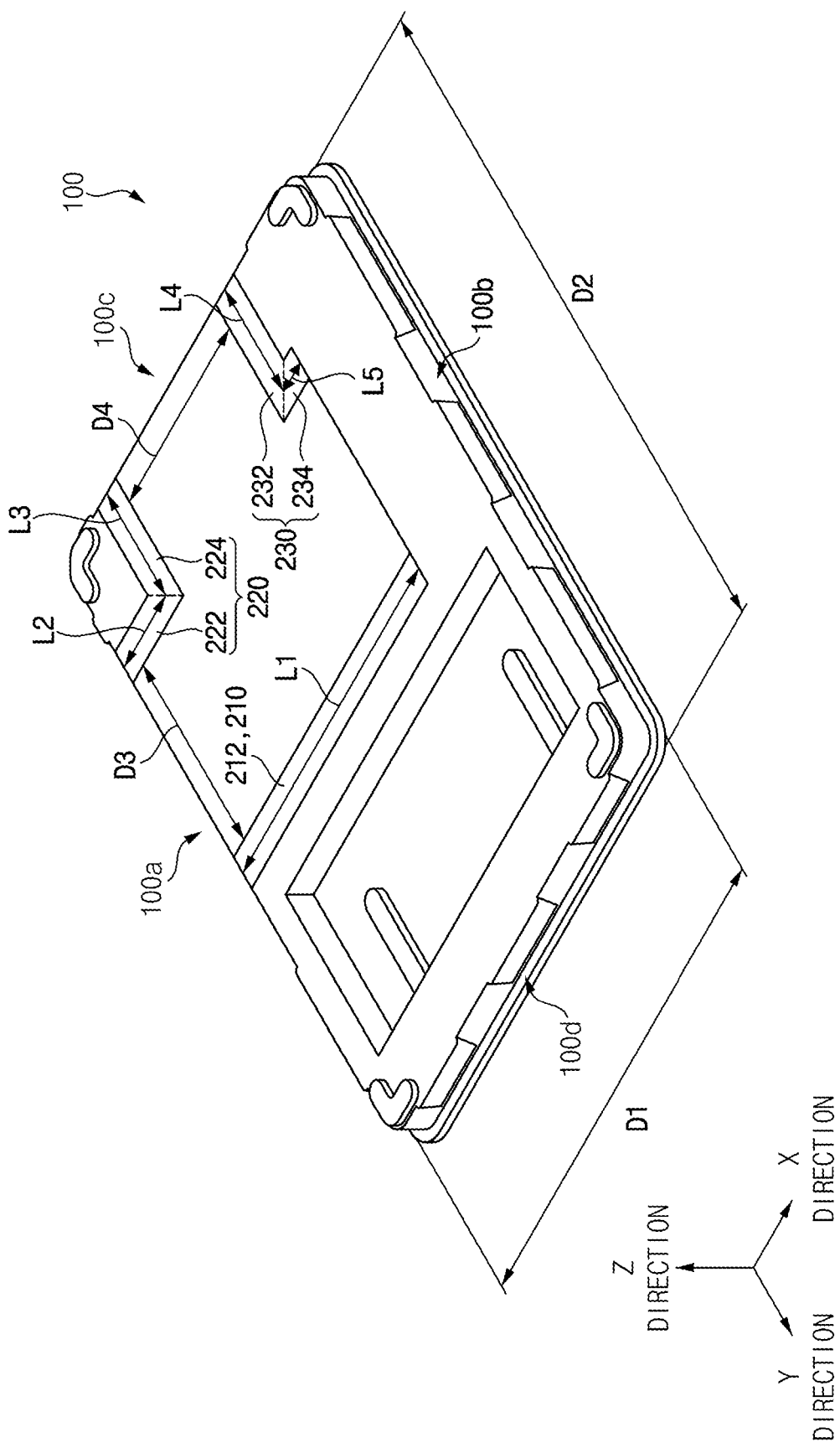
FIG. 2 is a perspective view illustrating a cover structure of a module tray in accordance with example embodiments.
Figure 3:
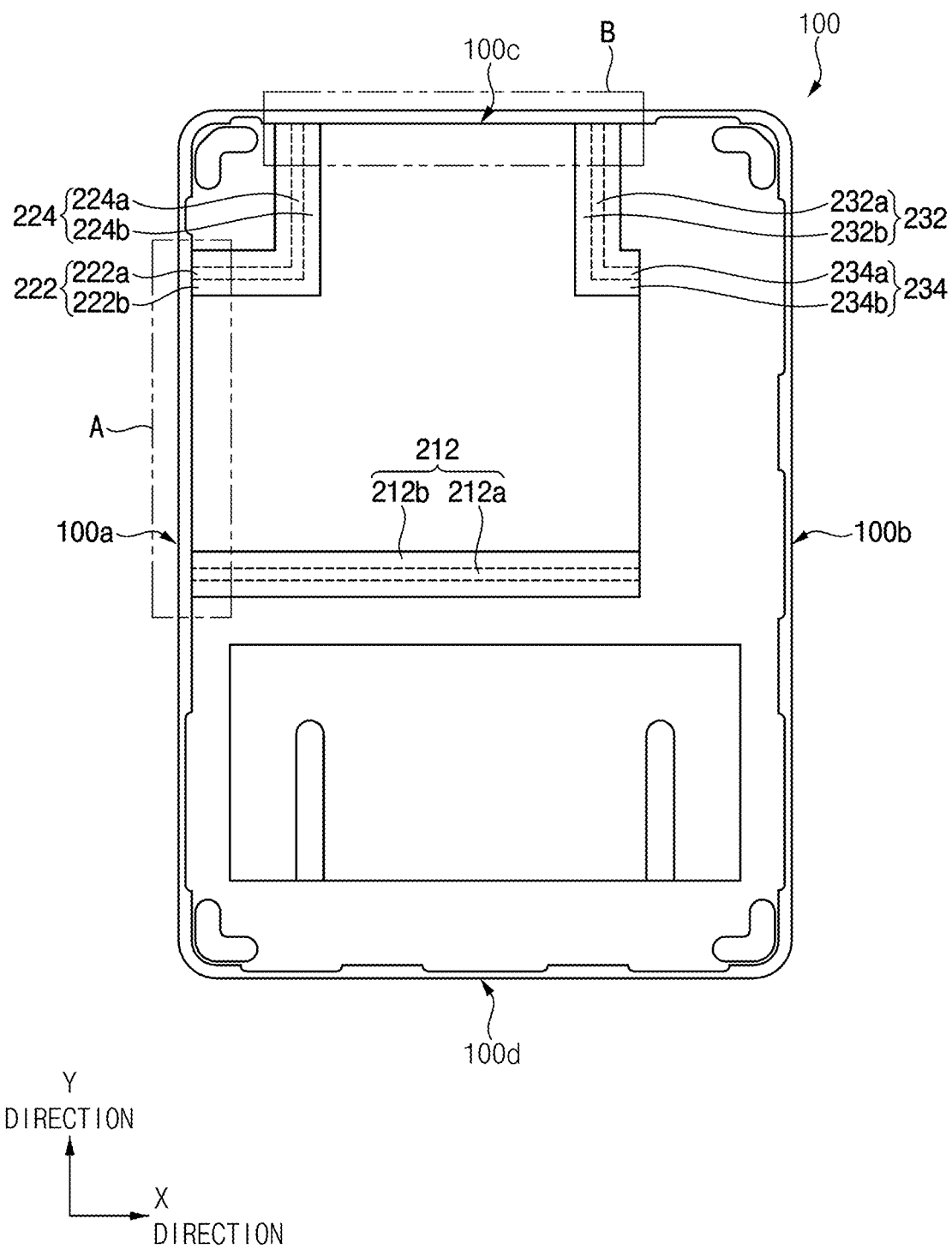
FIG. 3 is a plan view illustrating the cover structure in FIG. 2.
Figure 4:
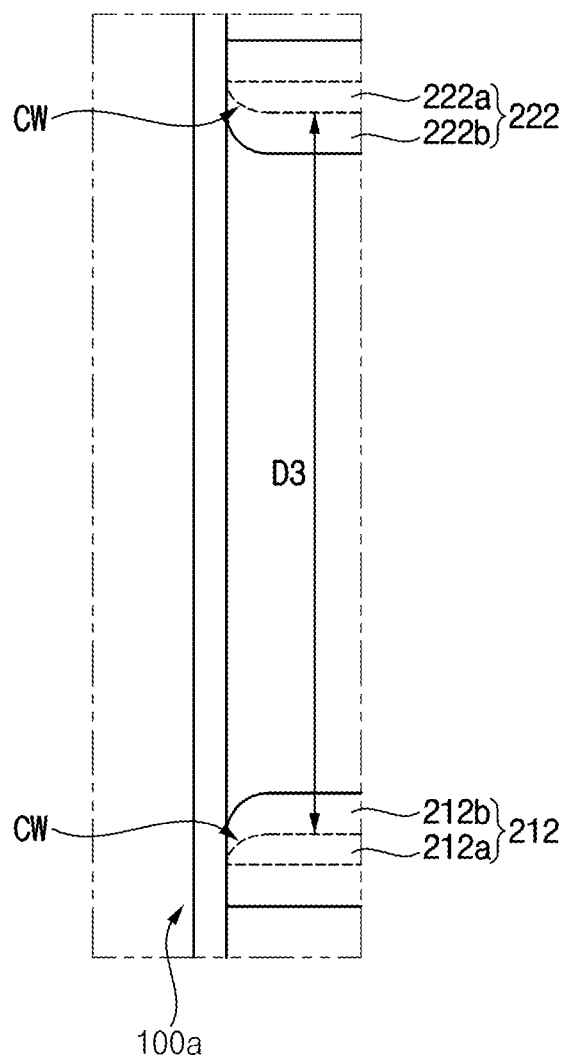
FIG. 4 is an enlarged plan view illustrating portion 'A' in FIG. 3.
Figure 5:
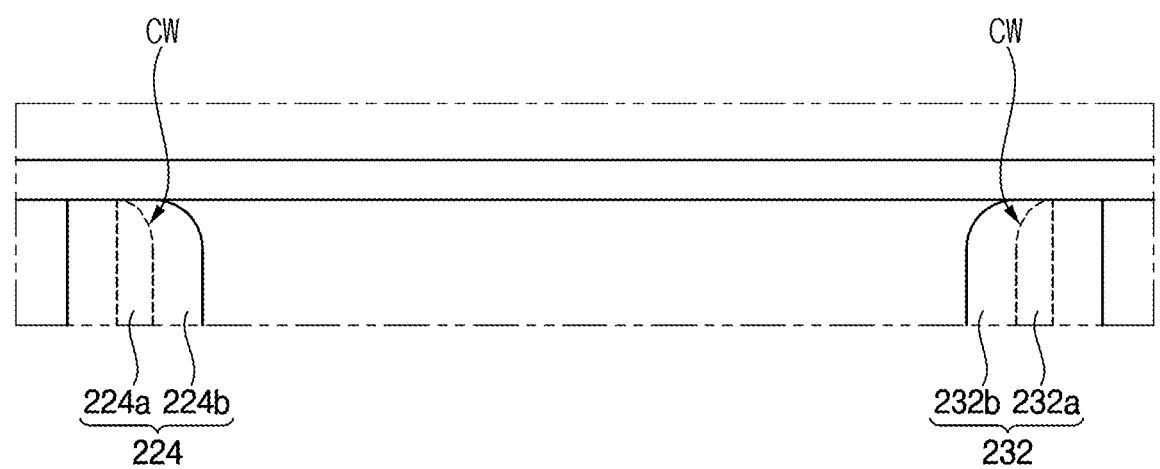
FIG. 5 is an enlarged plan view illustrating portion 'B' in FIG. 3.
Figure 5:
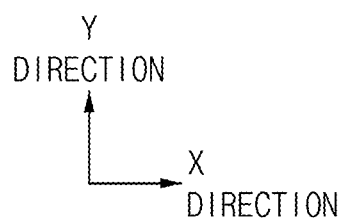
Figure 6:
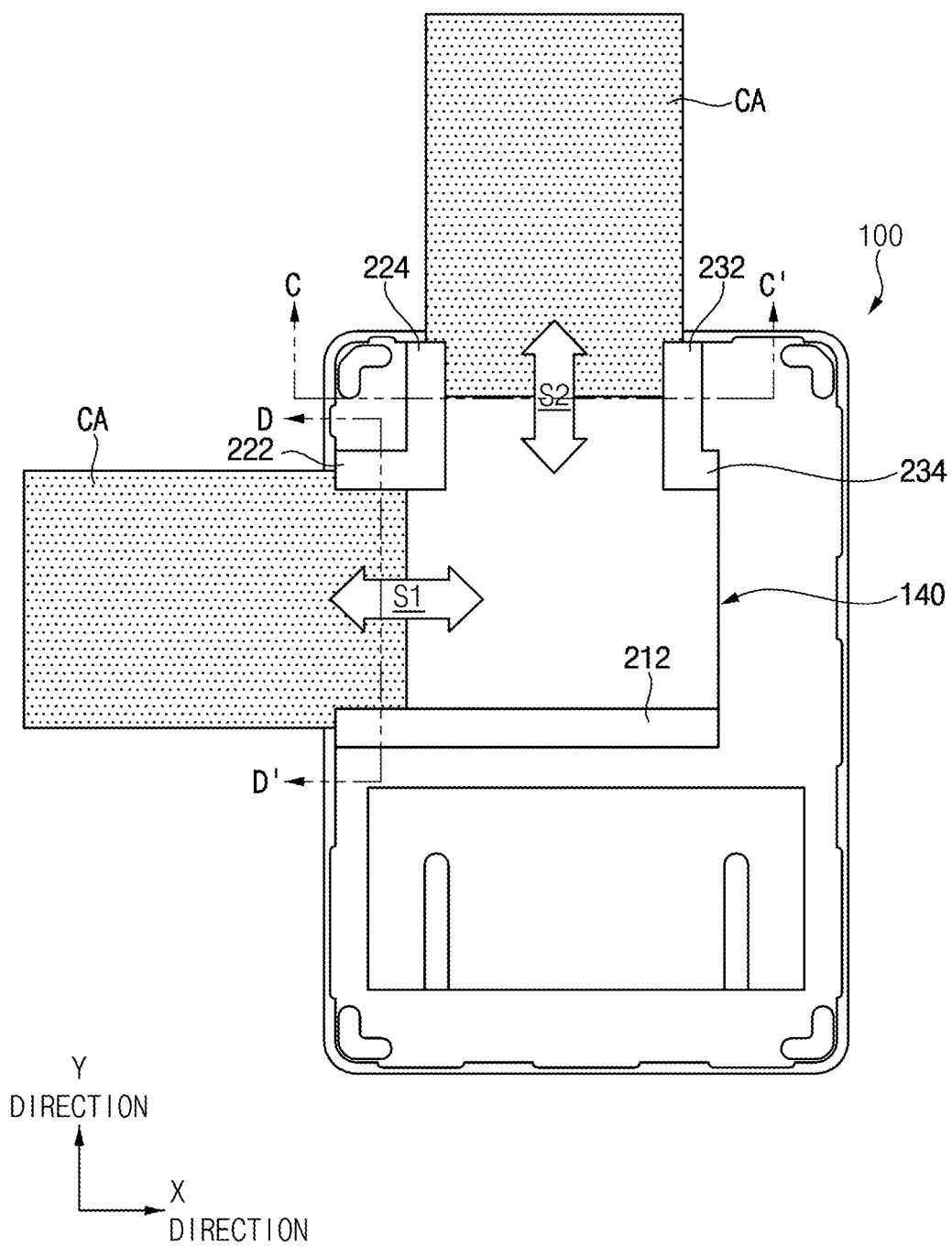
FIG. 6 is a plan view illustrating card accommodation directions into a cover structure.

FIG. 2 is a perspective view illustrating the cover structure 100. FIG. 3 is a plan view illustrating the cover structure 100. FIG. 4 is an enlarged plan view illustrating portion 'A' in FIG. 3. FIG. 5 is an enlarged plan view illustrating portion 'B' in FIG. 3. FIG. 6 is a plan view illustrating card accommodation directions into the cover structure 100.

Referring to FIGS. 1 to 6, the cover structure 100 may cover the case 20 that accommodates the semiconductor device. The cover structure 100 may cover the upper surface opening 26 of the case 20. The cover structure 100 may be combined with or separated from the case 20 to protect the semiconductor device that is accommodated in the case 20 from the outside. The cover structure 100 may include first and second side surfaces 100a and 100b opposite to each other, and third and fourth side surfaces 100c and 100d opposite to each other.

In this specification, a direction (X direction) between the first side surface 100a and the second side surface 100b is referred to as a first horizontal direction, a direction (Y direction) between the third side surface 100c and the fourth side surface 100d is referred to as a second horizontal direction, and a direction (Z direction) perpendicular to the first horizontal direction and the second horizontal direction is referred to as a vertical direction.

The cover structure 100 and the case 20 may include a same material as each other. For example, the cover structure 100 may include a metal material, e.g., stainless steel, iron (Fe), etc. In another example, the cover structure 100 may include a plastic material. The cover structure 100 may include the plastic material or the metal material that have strong hardness and high toughness.

When the semiconductor substrate is inserted into the case 20, the cover structure 100 may protect the semiconductor substrate that is accommodated therein from an external impact. In a state that the semiconductor substrate is not inserted, the cover structure 100 may be individually stored and managed. Since the cover structure 100 has a rectangular parallelepiped structure, a plurality of the cover structures may be stored in a stacked state.

For example, a first distance D1 between the first side surface 100a and the second side surface 100b may be smaller than a second distance D2 between the third side surface 100c and the fourth side surface 100d. The first distance D1 between the first side surface 100a and the second side surface 100b may be within a range of 200 mm to 300 mm. The second distance D2 between the third side surface 100c and the fourth side surface 100d may be within a range of 250 mm to 400 mm. A height from a lower surface to an upper surface of the cover structure 100 may be within a range of 15 mm to 20 mm.

For example, the cover structure 100 may be formed by a compression molding process. In another example, the cover structure 100 may be formed by an injection molding process, an extrusion molding process, a transfer molding process, a laminating molding process, a casting process, a thermoforming process or the like. The cover structure 100 that is formed by the compression molding process may have a thin thickness. For example, the thickness, e.g., of each wall, of the cover structure 100 may be within a range of 0.5 mm to 3 mm.

In example embodiments, the card accommodation portion 200 may be provided on the upper surface of the cover structure 100, e.g., on a surface of the cover structure 100 overlapping the upper surface opening 26 and facing away from the upper surface opening 26. The card accommodation portion 200 may accommodate a card CA on which data of the semiconductor device is recorded. The card accommodation portion 200 may selectively accommodate the card CA in the first horizontal direction (X direction) or the second horizontal direction (Y direction).

The card accommodation portion 200 may include first to third brackets 210, 220 and 230 that are capable of accommodating the card CA. The card accommodation portion 200 may accommodate the card CA within first and second accommodation spaces S1 and S2 that are defined by the cover structure 100 and the first to third brackets 210, 220 and 230. The first accommodation space S1 may be a space in which the card CA is inserted into in the first horizontal direction (X direction), and the second accommodation space S2 may be a space in which the card CA is inserted into in the second horizontal direction (Y direction).

The card CA may include a lot card. The lot card may include thin paper or thin plastic. The lot card may have a rectangular shape. For example, a horizontal length of the lot card may be within a range of 50 mm to 140 mm. A vertical length of the lot card may be within a range of 150 mm to 240 mm. A thickness of the lot card may be within a range of 0.1 mm to 1 mm. The card accommodation portion 200 may be variously modified according to a type, size, and material of the lot card.

The lot card may include the data of the semiconductor device. The lot card may display the data that is recorded by an operator on a surface. The lot card may include the data that has a manufacturing process of the semiconductor device in a semiconductor production management system. For example, the data may include a model name, a model number, a manufacturing date, an inspection date, a quantity, a process progress, and the like.

The card accommodation portion 200, e.g., the first through third brackets 210, 220, and 230 of the card accommodation portion 200, and the cover structure 100 may include a same material as each other. For example, the card accommodation portion 200 and the cover structure 100 may include a metal material, e.g., stainless steel, iron (Fe), etc. In another example, the card accommodation portion 200 and the cover structure 100 may include a plastic material, e.g., polyethylene (PE), polypropylene (PP), polystyrene (PS), polyethylene terephthalate (PET), polyamides (PA), polyester (PES), polyvinyl chloride (PVC), polyurethanes (PU), polycarbonate (PC), polyvinylidene chloride (PVDC), and the like.

In example embodiments, the first bracket 210 may include a first accommodation guide 212 that extends in the first horizontal direction (X direction) on the cover structure 100. The first bracket 210 may be fixed on the cover structure 100. The first bracket 210 may guide the card CA to the first accommodation space S1 together with the second and third brackets 230. The first bracket 210 may be attached on the cover structure 100 through an adhesive member.

Figure 8A:
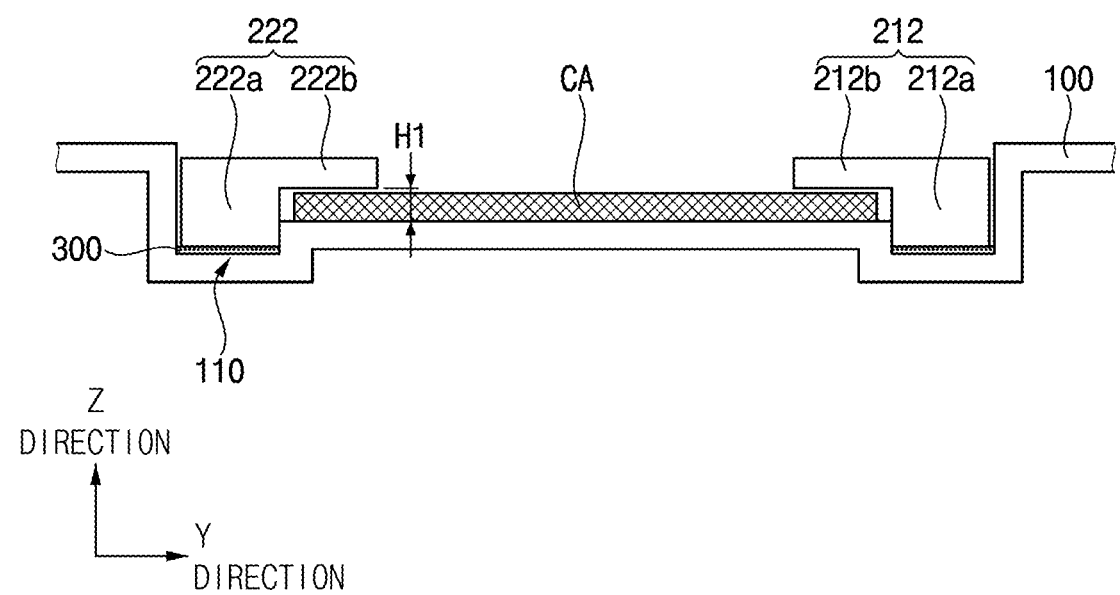
FIG. 8A to 8C are cross-sectional views taken along the line D-D' in FIG. 6.

The first accommodation guide 212 may include a first vertical guide portion 212a that is provided on the cover structure 100, and a first horizontal guide portion 212b that is provided on the first vertical guide portion 212a. For example, as illustrated in FIGS. 2 and 8A, the first vertical guide portion 212a may have a linear shape extending in the X direction that is provided on the cover structure 100. For example, as further illustrated in FIGS. 2 and 8A, the first horizontal guide portion 212b may extend perpendicularly from the first vertical guide portion 212a along an entire length of the first vertical guide portion 212a in the X direction, such that the first horizontal guide portion 212b overlaps an entire top surface of the first vertical guide portion 212a and overhangs the first vertical guide portion 212a to partially overlap a top surface of the cover structure 100. For example, as illustrated in FIG. 8A, a combined vertical cross-sectional shape of the first vertical guide portion 212a and the first horizontal guide portion 212b may be a rotated L-shape.

The first accommodation guide 212 may guide the card CA into the first accommodation space S1. The first accommodation guide 212 may define the first accommodation space S1 together with the second accommodation guide 222 of the second bracket 220 and the fifth accommodation guide 234 of the third bracket 230. The card CA inserted into the first accommodation space S1 may be guided by the first to third brackets 210, 220, and 230, and may come into contact with a protrusion 140 of the cover structure 100.

The first accommodation guide 212 may extend from the first side surface 100a of the cover structure 100 toward the second side surface 100b. The first accommodation guide 212 may extend from the first side surface 100a of the cover structure 100 to a protrusion 140 of the cover structure 100. The first accommodation guide 212 may extend by a first length L1 from the first side surface 100a. For example, the first length L1 may be within a range of 150 mm to 240 mm.

The first vertical guide portion 212a may protrude from, e.g., above, the cover structure 100 in the vertical direction (FIG. 8A). The first vertical guide portion 212a may support the card CA to guide into the first accommodation space S1. The first vertical guide portion 212a may restrict a movement of the card CA in the second horizontal direction (Y direction), such that the card CA is not removed (e.g., detached or separated) from the first accommodation space S1.

The first vertical guide portion 212a may have a curved sidewall CW at a first opened end through which the card CA is inserted into the first accommodation space S1, e.g., the curved sidewall CW faces an exterior of the cover structure 100. For example, as illustrated in FIG. 4, the curved sidewall CW of the first vertical guide portion 212a may be a curved surface connecting a surface of the first vertical guide portion 212a facing a second accommodation guide 222 (of the second bracket 220) with a surface of the first vertical guide portion 212a facing the first side surface 100a. As such, the first vertical guide portion 212a may widen an entrance of the first opened end such that the card CA is smoothly inserted into the first accommodation space S1 through the curved sidewall CW, e.g., the curved surface of the curved sidewall CW increases a width in the second direction between the first and second brackets 210 and 220 at the first side surface 100a. For example, the curved sidewall CW may have a fillet shape or a chamfer shape.

The first horizontal guide portion 212b may be provided on the first vertical guide portion 212a (FIG. 8A). The first horizontal guide portion 212b may extend from the first vertical guide portion 212a toward the first accommodation space S1. The first horizontal guide portion 212b may support the card CA to guide into the first accommodation space S1. The first horizontal guide portion 212b may restrict the movement of the card CA in the vertical direction (Z direction) such that the card CA is not removed (e.g., separated) from the first accommodation space S1.

A lower surface of the first horizontal guide portion 212b may be provided to be spaced apart from the upper surface of the cover structure 100 by a first height H1, e.g., so an edge of the card CA may fit in and be supported by the space between the lower surface of the first horizontal guide portion 212b and the upper surface of the cover structure 100 (FIG. 8A). For example, the first height H1 may be within a range of 1 mm to 5 mm.

In example embodiments, the second bracket 220 may include a second accommodation guide 222 that extends in the first horizontal direction (X direction) on the cover structure 100, and a third accommodation guide 224 that extends from the second accommodation guide 222 in the second horizontal direction (Y direction). The second bracket 220 may be provided to be spaced apart from the first bracket 210 on the cover structure 100. The second bracket 220 may guide the card CA into the first accommodation space S1 together with the first bracket 210. The second bracket 220 may guide the card CA into the second accommodation space S2 together with the third bracket 230. The second bracket 220 may be attached on the cover structure 100 through an adhesive member.

The second accommodation guide 222 may include a second vertical guide portion 222a that is provided on the cover structure 100, and a second horizontal guide portion 222b that is provided on the second vertical guide portion 222a, e.g., a relative configuration of the second vertical and horizontal guide portions 222a and 222b may be similar to that of first vertical and horizontal guide portions 212a and 212b. The second accommodation guide 222 may guide the card CA into the first accommodation space S1. The second accommodation guide 222 may define the first accommodation space S1 together with the first accommodation guide 212 of the first bracket 210 and the fifth accommodation guide 234 of the third bracket 230.

The second accommodation guide 222 may extend from the first side surface 100a of the cover structure 100 toward the second side surface 100b. The second accommodation guide 222 may extend by a second length L2 from the first side surface 100a. For example, the second length L2 may be within a range of 20 mm to 60 mm.

The second vertical guide portion 222a may protrude from the cover structure 100 in the vertical direction (Z direction). The second vertical guide portion 222a may support the card CA to guide into the first accommodation space S1. The second vertical guide portion 222a may restrict the movement of the card CA in the second horizontal direction (Y direction) such that the card CA is separated from the first accommodation space S1.

The second vertical guide portion 222a may have the curved sidewall CW at the first opened end through which the card CA is inserted into the first accommodation space S1, e.g., the structure and position of the curved sidewall CW of the second vertical guide portion 222a may be similar to that of the first vertical guide portion 212a. The second vertical guide portion 222a may widen the entrance of the first opened end such that the card CA is smoothly inserted into the first accommodation space S1 through the curved sidewall CW.

The second vertical guide portion 222a may be provided to be spaced apart from the first vertical guide portion 212a of the first bracket 210 by a third distance D3 in the second horizontal direction (Y direction), e.g., the third distance D3 may be measured between facing surfaces of the first and second vertical guide portions 212a and 222a. For example, the third distance D3 may be within a range of 50 mm to 150 mm. For example, since the curved sidewalls CW of the first and second vertical guide portions 212a and 222a widen the entrance of the first opened end, the width in the second direction between the first and second brackets 210 and 220 at the first side surface 100a may be larger than the third distance D3.

The second horizontal guide portion 222b may be provided on the second vertical guide portion 222a. The second horizontal guide portion 222b may extend from the second vertical guide portion 222a toward the first accommodation space S1. The second horizontal guide portion 222b may support the card CA to guide into the first accommodation space S1. The second horizontal guide portion 222b may restrict the movement of the card CA in the vertical direction (Z direction) such that the card CA is not separated from the first accommodation space S1. A lower surface of the second horizontal guide portion 222b may be provided to be spaced apart from the upper surface of the cover structure 100 by the first height H1 (FIG. 8A). For example, the first height H1 may be within a range of 1 mm to 5 mm.

The third accommodation guide 224 may include a third vertical guide portion 224a provided on the cover structure 100, and a third horizontal guide portion 224b provided on the third vertical guide portion 224a, e.g., a relative configuration of the third vertical and horizontal guide portions 224a and 224b may be similar to that of the first vertical and horizontal guide portions 212a and 212b. The third accommodation guide 224 may guide the card CA into the second accommodation space S2. The third accommodation guide 224 may define the second accommodation space S2 together with the first accommodation guide 212 of the first bracket 210 and the fourth accommodation guide 232 of the third bracket 230. The card CA inserted into the second accommodation space S2 may be guided by the second and third brackets 220 and 230, and may come into contact with the first bracket 210.

The third accommodation guide 224 may extend from the second accommodation guide 222 to the third side surface 100c of the cover structure 100. The third accommodation guide 224 may extend from the second accommodation guide 222 by a third length L3. For example, the third length L3 may be within a range of 30 mm to 80 mm.

The third vertical guide portion 224a may protrude from the cover structure 100 in the vertical direction (Z direction). The third vertical guide portion 224a may support the card CA to guide into the second accommodation space S2. The third vertical guide portion 224a may restrict the movement of the card CA in the first horizontal direction (X direction) such that the card CA is not separated from the second accommodation space S2.

The third vertical guide portion 224a may have the curved sidewall CW at a second opened end through which the card CA is inserted into the second accommodation space S2. The second vertical guide portion 222a may widen an entrance of the second opened end such that the card CA may be smoothly inserted into the second accommodation space S2 through the curved sidewall CW.

The third horizontal guide portion 224*b* may be provided on the third vertical guide portion 224*a*. The third horizontal guide portion 224*b* may extend from the third vertical guide portion 224*a* toward the second accommodation space S2. The third horizontal guide portion 224*b* may support the card CA to guide into the second accommodation space S2. The third horizontal guide portion 224*b* may restrict the movement of the card CA in the vertical direction (Z direction) such that the card CA is not separated from the second accommodation space S2.

Figure 7A:
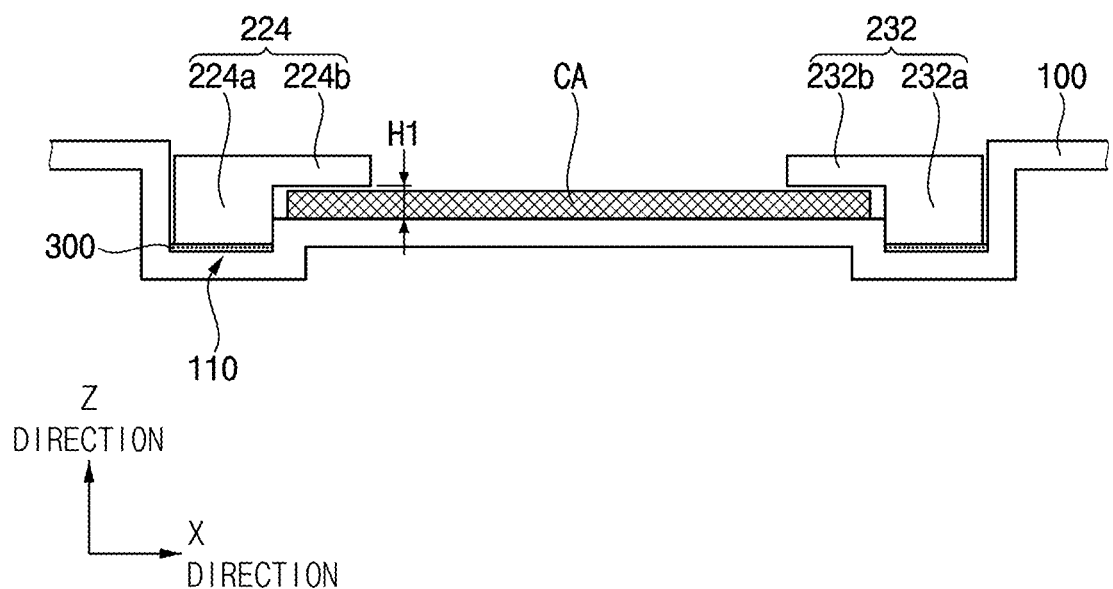
FIG. 7A to 7C are cross-sectional views taken along the C-C' in FIG. 6.

A lower surface of the third horizontal guide portion 224*b* may be provided to be spaced apart from the upper surface of the cover structure 100 by the first height H1 (FIG. 7A). For example, the first height H1 may be within a range of 1 mm to 5 mm.

In example embodiments, the third bracket 230 may include the fourth accommodation guide 232 that extends in the second horizontal direction (Y direction) on the cover structure 100, and the fifth accommodation guide 234 that extends from the fourth accommodation guide 232 in the first horizontal direction (X direction). The second bracket 220 may be provided to be spaced apart from the first and second brackets 210 and 220 on the cover structure 100. The third bracket 230 may guide the card CA into the first accommodation space S1 together with the first bracket 210. The third bracket 230 may guide the card CA to the second accommodation space S2 together with the second bracket 220. The third bracket 230 may be attached on the cover structure 100 through an adhesive member.

The fourth accommodation guide 232 may include the fourth vertical guide portion 232*a* provided on the cover structure 100, and a fourth horizontal guide portion 232*b* provided on the fourth vertical guide portion 232*a*, e.g., a relative configuration of the fourth vertical and horizontal guide portions 232*a* and 232*b* may be similar to that of first vertical and horizontal guide portions 212*a* and 212*b*. The fourth accommodation guide 232 may guide the card CA to the second accommodation space S2. The fourth accommodation guide 232 may define the second accommodation space S2 together with the first accommodation guide 212 of the first bracket 210 and the third accommodation guide 224 of the second bracket 220.

The fourth accommodation guide 232 may extend from the third side surface 100*c* of the cover structure 100 toward the fourth side surface 100*d*. The fourth accommodation guide 232 may extend by a fourth length L4 from the third side surface 100*c*. For example, the fourth length L4 may be within a range of 30 mm to 80 mm.

The fourth vertical guide portion 232*a* may protrude from the cover structure 100 in the vertical direction (Z direction). The fourth vertical guide portion 232*a* may support the card CA to guide into the second accommodation space S2. The fourth vertical guide portion 232*a* may restrict the movement of the card CA in the first horizontal direction (X direction) such that the card CA is not separated from the second accommodation space S2.

The fourth vertical guide portion 232*a* may have the curved sidewall CW at the second opened end through which the card CA is inserted into the second accommodation space S2. The fourth vertical guide portion 232*a* may widen the entrance of the second opened end such that the card CA is smoothly inserted into the second accommodation space S2 through the curved sidewall CW.

The fourth vertical guide portion 232*a* may be provided to be spaced apart from the third vertical guide portion 224*a* of the second bracket 220 by a fourth distance D4 in the first horizontal direction (X direction). For example, the fourth distance D4 may be within a range of 50 mm to 150 mm.

The fourth horizontal guide portion 232*b* may be provided on the fourth vertical guide portion 232*a*. The fourth horizontal guide portion 232*b* may extend from the fourth vertical guide portion 232*a* toward the second accommodation space S2. The fourth horizontal guide portion 232*b* may support the card CA to guide into the second accommodation space S2. The fourth horizontal guide portion 232*b* may restrict the movement of the card CA in the vertical direction (Z direction) such that the card CA is not separated from the second accommodation space S2.

A lower surface of the fourth horizontal guide portion 232*b* may be provided to be spaced apart from the upper surface of the cover structure 100 by the first height H1. For example, the first height H1 may be within a range of 1 mm to 5 mm.

The fifth accommodation guide 234 may include a fifth vertical guide portion 234*a* provided on the cover structure 100, and a fifth horizontal guide portion 234*b* provided on the fifth vertical guide portion 234*a*, e.g., a relative configuration of the fifth vertical and horizontal guide portions 234*a* and 234*b* may be similar to that of the first vertical and horizontal guide portions 212*a* and 212*b*. The fifth accommodation guide 234 may guide the card CA into the first accommodation space S1. The fifth accommodation guide 234 may define the first accommodation space S1 together with the first accommodation guide 212 of the first bracket 210 and the second accommodation guide 222 of the second bracket 220.

The fifth accommodation guide 234 may extend from the fourth accommodation guide 232 toward the second side surface 100*b* of the cover structure 100. The fifth accommodation guide 234 may extend from the fourth accommodation guide 232 to the protrusion 140 of the cover structure 100.

The fifth accommodation guide 234 may extend from the fourth accommodation guide 232 by a fifth length L5. For example, the fifth length L5 may be within a range of 20 mm to 60 mm.

The fifth vertical guide portion 234*a* may protrude from the cover structure 100 in the vertical direction (Z direction). The fifth vertical guide portion 234*a* may support the card CA to guide into the first accommodation space S1. The fifth vertical guide portion 234*a* may restrict the movement of the card CA in the second horizontal direction (Y direction) such that the card CA is not separated from the first accommodation space S1.

The fifth horizontal guide portion 234*b* may be provided on the fifth vertical guide portion 234*a*. The fifth horizontal guide portion 234*b* may extend from the fifth vertical guide portion 234*a* toward the first accommodation space S1. The fifth horizontal guide portion 234*b* may support the card CA to guide into the first accommodation space S1. The fifth horizontal guide portion 234*b* may restrict the movement of the card CA in the vertical direction (Z direction) such that the card CA is not separated from the first accommodation space S1.

A lower surface of the fifth horizontal guide portion 234*b* may be provided to be spaced apart from the upper surface of the cover structure 100 by the first height H1. For example, the first height H1 may be within a range of 1 mm to 5 mm.

Figure 7B:
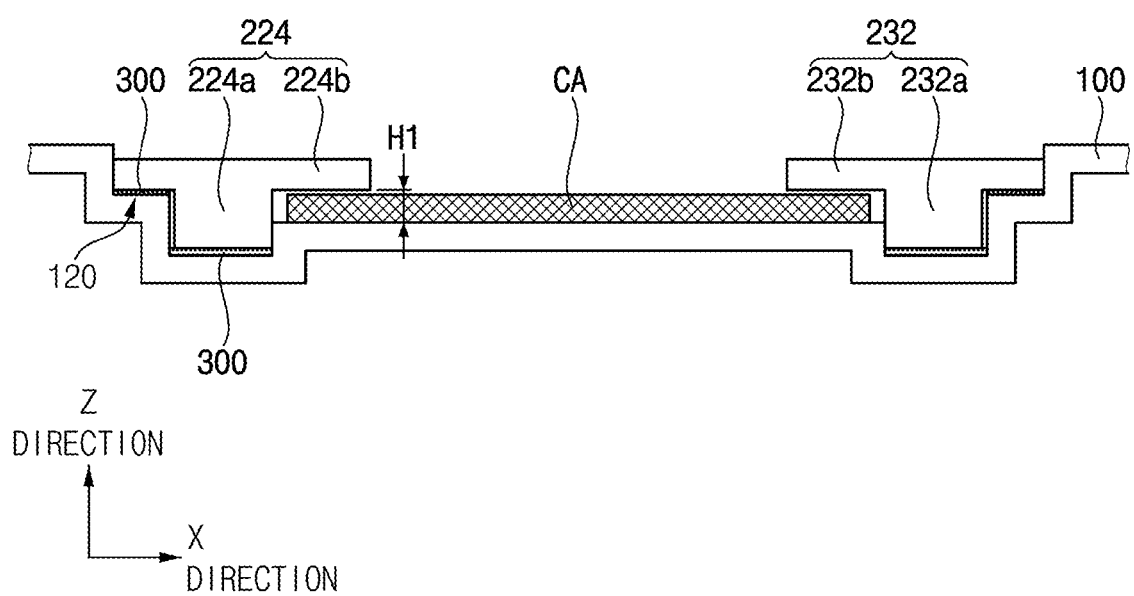
Figure 7C:
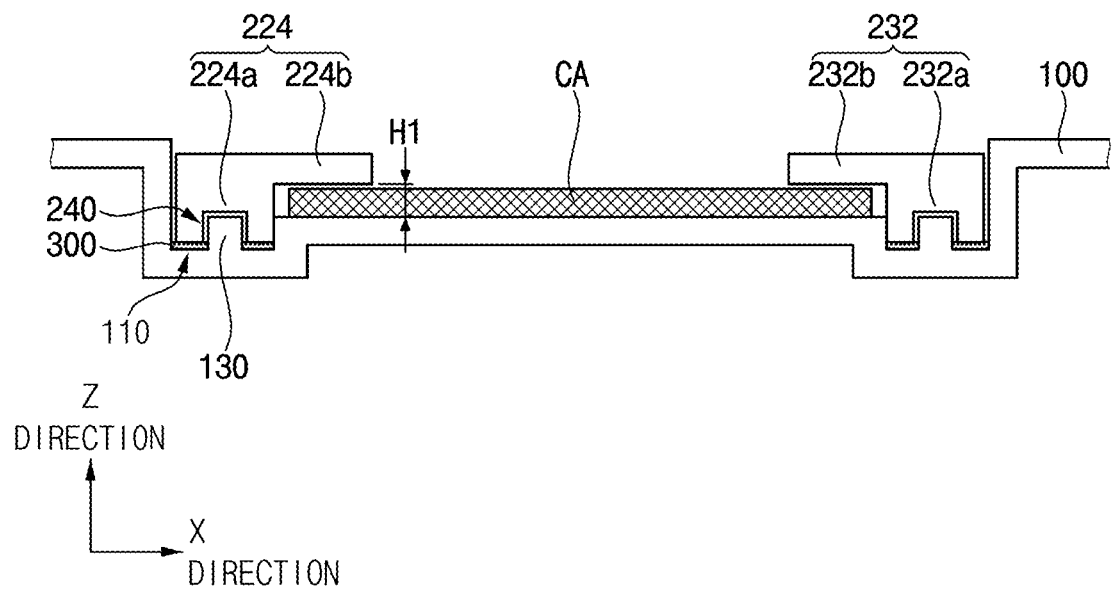
Figure 8B:
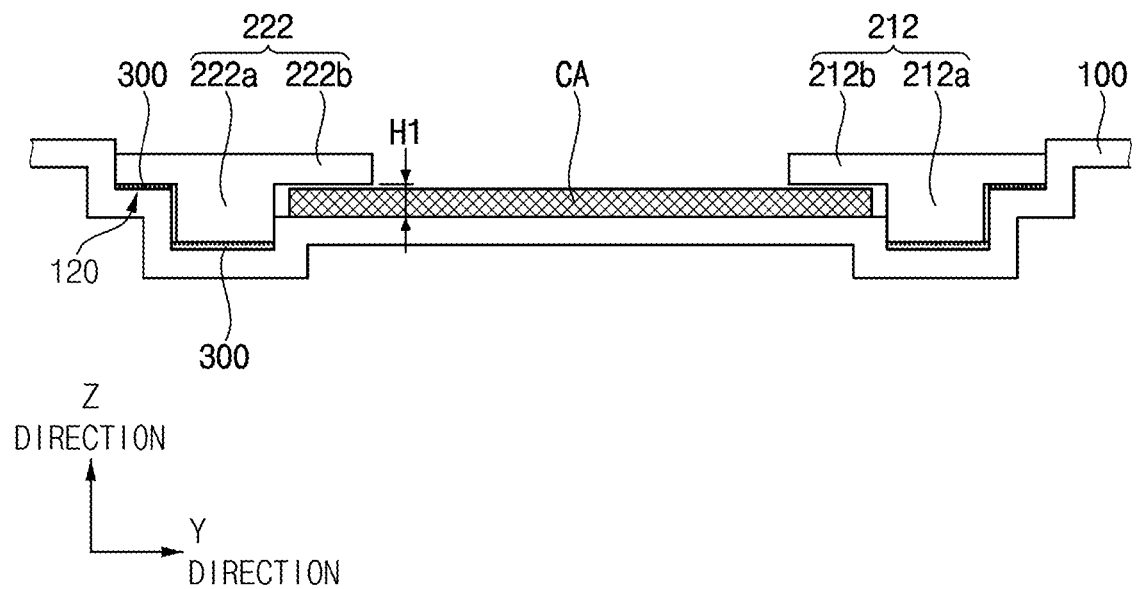
Figure 8C:
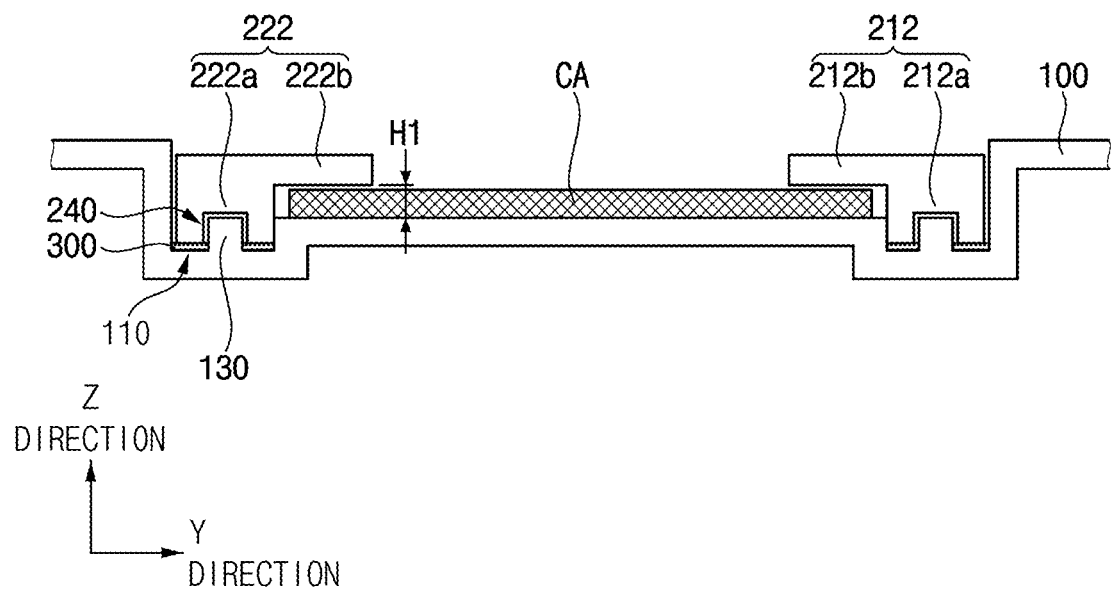

FIG. 7A to 7C are cross-sectional views taken along line C-C' in FIG. 6. FIG. 8A to 8C are cross-sectional views taken along line D-D' in FIG. 6.

Referring to FIGS. 2 to 8C, the first to third brackets 210, 220, and 230 may be fixed on the cover structure 100 through an adhesive member 300. The first to third brackets 210, 220 and 230 and the cover structure 100 may be strongly fixed through shapes that correspond to each other. For example, the adhesive member 300 may include epoxy molding compound (EMC), epoxy resin, UV resin, polyurethane resin, silicone resin, silica filler or the like.

As illustrated in FIGS. 7A and 8A, the cover structure 100 may have a plurality of coupling grooves 110 into which the first to third brackets 210, 220, and 230 are inserted and fixed. For example, the coupling groove 110 may extend in the same direction as the first to third brackets 210, 220, and 230, e.g., each coupling groove 110 may extend continuously to accommodate a respective one of the first to third brackets 210, 220, and 230. In another example, a plurality of coupling grooves 110 may be arranged in the same direction as the first to third brackets 210, 220, and 230, e.g., a plurality of coupling grooves 110 may be aligned with each other and spaced apart from each other to accommodate a respective one of the first to third brackets 210, 220, and 230.

Sidewalls in the coupling grooves 110 may restrict movements of the first to third brackets 210, 220, and 230 in the first and second horizontal directions. The coupling grooves 110 may increase coupling force between the first to third brackets 210, 220, and 230 and the cover structure 100. The first to fifth vertical guide portions 212a, 222a, 224a, 232a, and 234a of each of the first to third brackets 210, 220, and 230 may be inserted into the coupling grooves 110, respectively. The lower surface of each of the first to fifth vertical guide portions 212a, 222a, 224a, 232a, and 234a may be adhesively fixed to the coupling grooves 110 of the cover structure 100 through the adhesive member 300.

As illustrated in FIGS. 7B and 8B, the cover structure 100 may further include a plurality of coupling patterns 120 to increase a contact area with the first to third brackets 210, 220, and 230. The coupling patterns 120 may extend in the same direction as the first to third brackets 210, 220, and 230.

Upper surfaces of the coupling patterns 120 may restrict the movement of the first to third brackets 210, 220, and 230 in the first and second horizontal directions. The coupling patterns 120 may increase the coupling force between the first to third brackets 210, 220, and 230 and the cover structure 100. The first to fifth horizontal guide portions 212b, 222b, 224b, 232b, and 234b of each of the first to third brackets 210, 220, and 230 may contact the upper surface of the coupling patterns 120. The first to fifth horizontal guide portions 212b, 222b, 224b, 232b, and 234b of each of the first to third brackets 210, 220, and 230 may extend toward the coupling patterns 120, respectively. The lower surfaces of each of the first to fifth horizontal guide portions 212b, 222b, 224b, 232b, and 234b may be adhesively fixed to the coupling patterns 120 of the cover structure 100 through the adhesive member 300. For example, as illustrated in FIGS. 7B and 8B, upper surfaces of the coupling patterns 120 may be integral and coplanar with upper surfaces of the first to third brackets 210, 220, and 230 to define a T-shaped vertical cross-section.

As illustrated in FIGS. 7C and 8C, the cover structure 100 may further include a plurality of coupling joints 130 that protrude from the coupling grooves 110. The first to third brackets 210, 220, and 230 may be inserted and fixed onto the coupling joints 130 of the cover structure 100. For example, the coupling joints 130 may extend, e.g., continuously, in the same direction as the first to third brackets 210, 220, and 230, respectively. In another example, a plurality of coupling joints 130 may be arranged in the same direction as a corresponding one of the first to third brackets 210, 220, and 230.

The first to fifth vertical guide portions 212a, 222a, 224a, 232a, and 234a of the first to third brackets 210, 220, and 230 may include fixing grooves 240 that combine with the coupling joints 130 on a lower surface. The coupling joint 130 may be inserted into the fixing groove 240 that is provided on the lower surface of each of the first to fifth vertical guide portions 212a, 222a, 224a, 232a, and 234a of the first to third brackets 210, 220, and 230.

The coupling joints 130 may restrict the movement of the first to third brackets 210, 220, and 230 in the first and second horizontal directions. The coupling joints 130 may increase the coupling force between the first to third brackets 210, 220, and 230 and the cover structure 100. The lower surface of each of the first to fifth vertical guide portions 212a, 222a, 224a, 232a, and 234a may be adhesively fixed to the coupling joint 130 of the cover structure 100 through the adhesive member 300.

Figure 9:
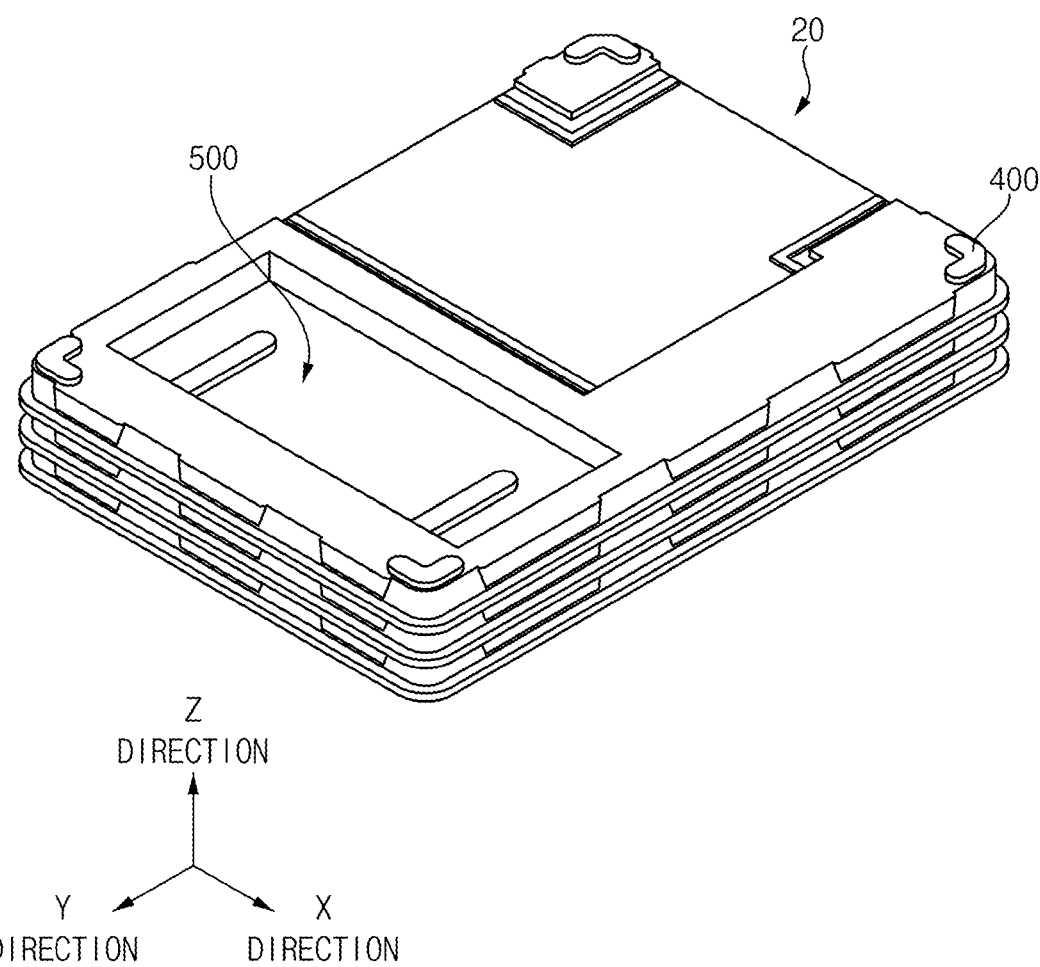
FIG. 9 is a perspective view illustrating a plurality of cover structures stacked through non-slip pads.

FIG. 9 is a perspective view illustrating a plurality of cover structures stacked through non-slip pads.

Referring to FIG. 9, the cover structure 100 may further include a plurality of non-slip pads 400. The non-slip pads 400 may be provided to protrude in the vertical direction (Z direction) from the upper surface of the cover structure 100 at corner regions, respectively.

For example, when another case is stacked on the cover structure 100 in a state in which the case 20 and the cover structure 100 are combined, the non-slip pads 400 may support a lower surface of the other case. In another example, when a plurality of different cover structures 100 are stacked on each other, the non-slip pads 400 may support lower surfaces of the different cover structures.

For example, the case 20 may have a shape that corresponds to the non-slip pads 400 of the cover structure 100 such that the lower surface of the case 20 may be combined with or separated from the non-slip pads 400. A lower surface of other cover structure may have a shape that corresponds to the non-slip pads 400.

In example embodiments, the module tray 10 for the semiconductor device may further include a storage device in which the data of the semiconductor device is stored. The storage device may include a Radio Frequency Identification (RFID) tag in which the data of the semiconductor device is stored. The storage device may transmit and receive the data of the semiconductor device through a magnetic or electric field.

The cover structure 100 may further include a tag accommodation portion 500. The tag accommodation portion 500 may include a cavity shape formed on the upper surface of the cover structure 100. The tag accommodation portion 500 may provide a space in which the storage device is accommodated.

Figure 10:
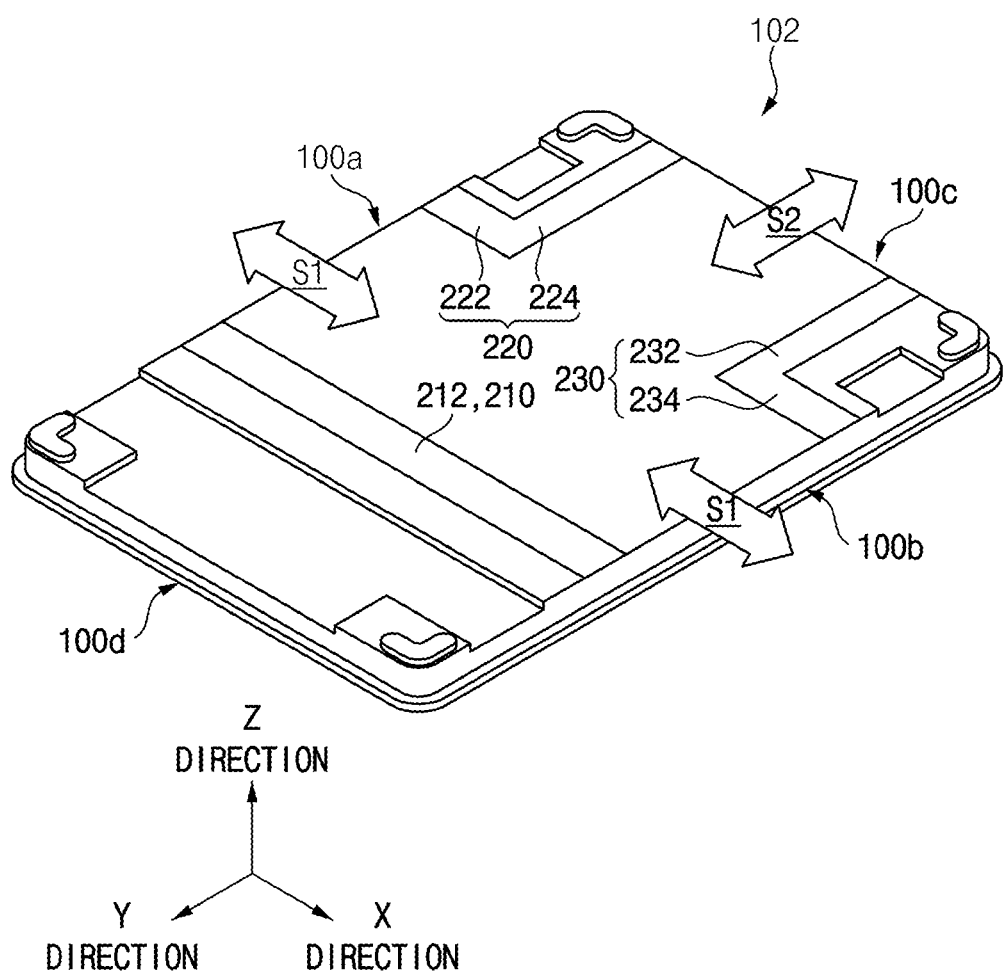
FIG. 10 is a perspective view illustrating a cover structure having modified brackets in accordance with example embodiments.

FIG. 10 is a perspective view illustrating a cover structure 102 having modified brackets in accordance with example embodiments. The cover structure 102 may be substantially the same as or similar to the cover structure 100 described with reference to FIGS. 2 to 9, except for a configuration of the brackets. Thus, same or similar components are denoted by the same or similar reference numerals, and repeated descriptions of the same components will be omitted.

Referring to FIG. 2, in example embodiments, the first bracket 210 may have the first accommodation guide 212 that extends in the first horizontal direction (X direction) on the cover structure 102, e.g., the first accommodation guide 212 may extend along an entire length of the cover structure 102 in the first horizontal direction. The third bracket 230 may include the fourth accommodation guide 232 extending in the second horizontal direction (Y direction) on the cover structure 102, and the fifth accommodation guide 234 extending from the fourth accommodation guide 232 in the first horizontal direction (X direction).

The first accommodation guide 212 may guide the card CA into the first accommodation space S1. The fifth accommodation guide 234 may guide the card CA into the first accommodation space S1. In other words, the first accommodation guide 212, the second accommodation guide 222 of the second bracket 220, and the fifth accommodation guide 234 of the third bracket 230 may together define the first accommodation space S1.

The first accommodation guide 212 may extend from the first side surface 100a to the second side surface 100b of the cover structure 100. The fifth accommodation guide 234 may extend from the fourth accommodation guide 232 toward the second side surface 100b of the cover structure 100. The fifth accommodation guide 234 may extend from the fourth accommodation guide 232 to the second side surface 100b of the cover structure 100.

The first accommodation space S1 may be opened to both the first side surface 100a and the second side surface 100b of the cover structure 100. The card CA may be selectively inserted into the first accommodation space S1 on one of the first and second side surfaces 100a and 100b of the cover structure 100. The card CA inserted into the first accommodation space S1 may be guided by the first to third brackets 210, 220, and 230, and the inserted card CA may be removed in an opposite direction.

As described above, the cover for the semiconductor module tray may cover the upper surface opening 26 of the case 20 in which the semiconductor device is accommodated through the cover structure 100. Since the cover structure 100 covers the upper surface opening 26 of the case 20, the cover structure 100 may block foreign substances, particles, and the like that flow into the semiconductor device accommodated in the case 20.

Also, when the cover structure 100 covers the case 20 and it is difficult to recognize the data of the semiconductor device accommodated in the case 20, the card CA may be inserted into or removed from the card accommodation portion 200 to recognize the data. The card CA may be inserted into the card accommodation portion 200 in the first and second horizontal directions through the first to third brackets 210, 220 and 230. Since the card CA is selectively inserted into at least one of the first and second horizontal directions, a convenience of card storage increases.

By way of summation and review, when a case of a module tray is left or moved in a state that the upper side opening of the case accommodating semiconductor substrates is open, foreign substances, particles, etc. may adhere to the semiconductor substrates, thereby potentially causing product defects. However, when the upper side opening of the case is covered with a cover, information about the semiconductor substrates accommodated in the module tray cannot be recognized.

In contrast, example embodiments provide a cover for a module tray protecting semiconductor substrates that are accommodated in a case from foreign substances, and having a card accommodation portion that accommodates a card having information of the semiconductor substrates. Example embodiments also provide a module tray for a semiconductor device including the cover.

That is, the cover for the semiconductor module tray may cover an upper surface opening of the case in which the semiconductor device is accommodated through the cover structure. Since the cover structure covers the upper surface opening of the case, the cover structure may block foreign substances, particles, and the like that may potentially flow into the semiconductor device accommodated in the case.

Also, when the cover structure covers the case, the card may be inserted into or removed from the card accommodation portion to identify data of the semiconductor device accommodated in the case. The card may be inserted into the card accommodation portion in the first and second horizontal directions through the first to third brackets. Since the card is selectively inserted into at least one of the first and second horizontal directions, a convenience of card storage increases.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A cover for a module tray, the cover comprising:
a cover structure configured to cover a case accommodating a semiconductor device; and
a card accommodation portion on an upper surface of the cover structure, the card accommodation portion being configured to accommodate a card to be slidably inserted in a first horizontal direction or in a second horizontal direction perpendicular to the first horizontal direction, the card accommodation portion including:
a first bracket having a first accommodation guide, the first accommodation guide extending in the first horizontal direction,
a second bracket spaced apart from the first bracket, the second bracket having a second accommodation guide and a third accommodation guide, the second accommodation guide extending in the first horizontal direction to face the first accommodation guide, and the third accommodation guide extending in the second horizontal direction, and
a third bracket spaced apart from the first bracket and from the second bracket, the third bracket having a fourth accommodation guide and a fifth accommodation guide, the fourth accommodation guide extending in the first horizontal direction to face the first accommodation guide and to define a first accommodation space with the first and second accommodation guides, and the fifth accommodation guide extending in the second horizontal direction to face the third accommodation guide and to define a second accommodation space with the third accommodation guide,
wherein the first accommodation guide and the second accommodation guide both extend in the first horizontal direction from a first side of the cover structure to form a first open slot at the first side of the cover structure,
wherein the third accommodation guide and the fifth accommodation guide both extend in the second horizontal direction from a second side of the cover structure perpendicular to and adjacent to the first side to form a second open slot at the second side of the cover structure, wherein the first open slot is configured to cause the card slidably inserted in the first horizontal direction into the card accommodation portion to be guided in the first horizontal direction, and wherein the second open slot is configured to cause the card slidably inserted in the second horizontal direction into the card accommodation portion to be guided in the second horizontal direction.

2. The cover as claimed in claim 1, wherein each of the first to fifth accommodation guides includes:
a vertical guide portion extending in a vertical direction from the cover structure, the vertical guide portion supporting configured to abut a side surface of the card to guide the card into the first accommodation space or the second accommodation space; and
a horizontal guide portion extending from the vertical guide portion in the first horizontal direction into the first accommodation space or in the second horizontal direction into the second accommodation space to support cover an upper surface of the card.

3. The cover as claimed in claim 2, wherein the horizontal guide portion includes a curved sidewall facing an exterior of the cover structure, wherein for each of the first, second, third, and fifth accommodation guides, the curved sidewall forms part of one of the open slots.

4. The cover as claimed in claim 2, wherein a lower surface of the horizontal guide portion is spaced apart from the upper surface of the cover structure by a first height, the first height being within a range of 1 mm to 5 mm.

5. The cover as claimed in claim 1, wherein:
the second bracket is spaced apart from the first bracket by a first distance in the second horizontal direction,
the third bracket is spaced apart from the first bracket by a second distance in the second horizontal direction, and
each of the first distance and the second distance is within a range of 50 mm to 150 mm.

6. The cover as claimed in claim 1, further comprising an adhesive member between each of the first to third brackets and the cover structure.

7. The cover as claimed in claim 1, further comprising:
a fixing groove in a lower surface of each of the first to third brackets; and
coupling joints protruding from the upper surface of the cover structure, each of the coupling joints being coupled to the fixing groove of a corresponding one of the first to third brackets.

8. The cover as claimed in claim 1, wherein the cover structure further includes non-slip pads that protrude from the upper surface of the cover structure at corner regions, respectively.

9. The cover as claimed in claim 1, further comprising a radio frequency identification tag on the cover structure.

10. A cover for a module tray, the cover comprising:
a cover structure configured to cover a case accommodating a semiconductor device;
a first bracket having a first accommodation guide that extends in a first horizontal direction on an upper surface of the cover structure;
a second bracket spaced apart from the first bracket in a second horizontal direction perpendicular to the first horizontal direction, the second bracket having a second accommodation guide and a third accommodation guide, the second accommodation guide extending lengthwise in the first horizontal direction, and the third accommodation guide connected to the second accommodation guide and extending lengthwise in a the second horizontal direction perpendicular to the first horizontal direction; and
a third bracket spaced apart from the first bracket and from the second bracket, the third bracket having a fourth accommodation guide and a fifth accommodation guide, the fourth accommodation guide extending lengthwise in the first horizontal direction to define a first accommodation space with the first and second accommodation guides to accommodate a lot card, and the fifth accommodation guide extending lengthwise in the second horizontal direction to define a second accommodation space with the first and third accommodation guides to accommodate the lot card,
wherein the first accommodation guide and the second accommodation guide both extend in the first horizontal direction from a first side of the cover structure to form a first open slot at the first side of the cover structure,
wherein the third accommodation guide and the fifth accommodation guide both extend in the second horizontal direction from a second side of the cover structure perpendicular to and adjacent to the first side to form a second open slot at the second side of the cover structure.

11. The cover as claimed in claim 10, wherein each of the first to fifth accommodation guides includes:
a vertical guide portion extending vertically from the cover structure, the vertical guide portion configured to abut a side surface of the lot card to guide the lot card into the first accommodation space or the second accommodation space; and
a horizontal guide portion extending from the vertical guide portion in the first horizontal direction into the first accommodation space or in the second horizontal direction into the second accommodation space to cover an upper surface of the lot card.

12. The cover as claimed in claim 11, wherein the horizontal guide portion includes a curved sidewall facing an exterior of the cover structure, wherein for each of the first, second, third, and fifth accommodation guides, the curved sidewall forms part of one of the open slots.

13. The cover as claimed in claim 11, wherein a lower surface of the horizontal guide portion is spaced apart from an upper surface of the cover structure by a first height, the first height being within a range of 1 mm to 5 mm.

14. The cover as claimed in claim 10, wherein:
the second bracket is spaced apart from the first bracket by a first distance in the second horizontal direction, the third bracket is spaced apart from the first bracket by a second distance in the second horizontal direction, and each of the first and second distances is within a range of 50 mm to 150 mm.

15. The cover as claimed in claim 10, further comprising an adhesive member between each of the first to third brackets and the cover structure.

16. The cover as claimed in claim 10, further comprising:
a fixing groove on a lower surface of each of the first to third brackets; and
coupling joints that protrude from an upper surface of the cover structure, each of the coupling joints being coupled to the fixing groove of a corresponding one of the first to third brackets.

17. The cover as claimed in claim 10, further comprising a radio frequency identification tag on the cover structure.

18. A module tray for a semiconductor device, the module tray comprising:
- a case configured to accommodate the semiconductor device, the case having an upper side opening at an upper end thereof;
- a cover structure configured to be detachably mounted on the case, the cover structure being configured to cover the upper side opening; and
- a card accommodation portion on the cover structure, the card accommodation portion having a first accommodation portion and a second accommodation portion, the first accommodation portion being configured to accommodate a lot card in a first horizontal direction, and the second accommodation portion being configured to accommodate the lot card in a second horizontal direction perpendicular to the first horizontal direction,
- wherein the card accommodation portion includes:
- a first bracket having a first accommodation guide that extends lengthwise in the first horizontal direction,
- a second bracket spaced apart from the first bracket, the second bracket having a second accommodation guide and a third accommodation guide, the second accommodation guide extending lengthwise in the first horizontal direction to face the first accommodation guide, and the third accommodation guide extending in the second horizontal direction, and
- a third bracket spaced apart from the first and second brackets, the third bracket having a fourth accommodation guide and a fifth accommodation guide, the fourth accommodation guide extending in the first horizontal direction to face the first accommodation guide to define a first accommodation space with the first and second accommodation guides, and the fifth accommodation guide extending in the second horizontal direction to face the third accommodation guide and to define a second accommodation space with the third accommodation guide,
- wherein the first accommodation guide and the second accommodation guide both extend in the first horizontal direction from a first side of the cover structure to form a first open slot at the first side of the cover structure,
- wherein the third accommodation guide and the fifth accommodation guide both extend in the second horizontal direction from a second side of the cover structure perpendicular to and adjacent to the first side to form a second open slot at the second side of the cover structure,
- wherein the first open slot is configured to cause the lot card when slidably inserted in the first horizontal direction into the card accommodation portion to be guided in the first horizontal direction, and
- wherein the second open slot is configured to cause the lot card when slidably inserted in the second horizontal direction into the card accommodation portion to be guided in the second horizontal direction.

* * * * *